United States Patent
Cui et al.

(10) Patent No.: US 10,520,963 B2
(45) Date of Patent: Dec. 31, 2019

(54) VOLTAGE MONITORING CIRCUIT THAT MANAGES VOLTAGE DRIFT CAUSED FROM NEGATIVE BIAS TEMPERATURE INSTABILITY

(71) Applicant: Texas Instruments Incorporated, Dallas, TX (US)

(72) Inventors: Zhenghao Cui, Beijing (CN); Yadan Shen, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/966,997

(22) Filed: Apr. 30, 2018

(65) Prior Publication Data

US 2019/0196524 A1    Jun. 27, 2019

Related U.S. Application Data

(63) Continuation of application No. PCT/CN2017/118313, filed on Dec. 25, 2017.

(51) Int. Cl.
*G05F 1/575* (2006.01)
*G01R 19/00* (2006.01)
(Continued)

(52) U.S. Cl.
CPC ......... *G05F 1/575* (2013.01); *G01R 19/0038* (2013.01); *H03F 1/342* (2013.01); *H03G 5/28* (2013.01)

(58) Field of Classification Search
CPC combination set(s) only.
See application file for complete search history.

(56) References Cited

U.S. PATENT DOCUMENTS 7,821,330 B2 * 10/2010 Wang ................. G05F 1/56
                                                    323/313
9,651,965 B2 *  5/2017 Cui .................... G05F 1/575
(Continued)

FOREIGN PATENT DOCUMENTS

CN      1847860 A    10/2006
CN    102075086 A     5/2011
CN    103123513 A     5/2013

OTHER PUBLICATIONS

International Search Report dated Sep. 30, 2018.

*Primary Examiner* — Hai L Nguyen
(74) *Attorney, Agent, or Firm* — Laurence J. Bassuk; Charles A. Brill; Frank D. Cimino (57) ABSTRACT

Regulating voltages at inputs of an electronic device by performing at least the following: receiving, at a voltage monitoring circuit, a monitoring voltage corresponding to a power system, determining, at the voltage monitoring circuit, whether the monitoring voltage is equal to or exceeds a monitoring threshold voltage, receiving, at the voltage monitoring circuit, an output indicating whether an inputted reference voltage and an inputted feedback voltage at a comparator circuit differs, regulating, at the voltage monitoring circuit, a feedback voltage to match the inputted reference voltage based on the output and a determination that the monitoring voltage is equal to or exceeds the monitoring threshold voltage, and providing, from the voltage monitoring circuit, the feedback voltage as an updated inputted feedback voltage for the comparator circuit.

15 Claims, 4 Drawing Sheets

(51) Int. Cl.
*H03F 1/34* (2006.01)
*H03G 5/28* (2006.01)

(56) References Cited

U.S. PATENT DOCUMENTS

| | | | |
|---|---|---|---|
| 9,651,966 B2* | 5/2017 | Cui | ............ G05F 1/562 |
| 10,088,856 B2* | 10/2018 | Xu | ............ G05F 1/56 |
| 2009/0153123 A1 | 6/2009 | Kraft | |

* cited by examiner

VOLTAGE MONITORING CIRCUIT THAT MANAGES VOLTAGE DRIFT CAUSED FROM NEGATIVE BIAS TEMPERATURE INSTABILITY

BACKGROUND

Negative bias temperature instability (NBTI) is the tendency of a p-type metal oxide semiconductor (PMOS) transistor to degrade in performance when the PMOS transistor is negatively biased at the gate terminal relative to the remaining terminals of the transistor. The degree of NBTI-induced degradation varies in accordance with the amount of the stress voltage, temperature and duration of waveform transitions, the age of the transistors, and characteristics of the transistors being stressed, such as the threshold voltage and drive current, over a period of time. NBTI can increase the required threshold voltage of the transistor gate and decrease the drive current of the transistor. As a result, NBTI is a reliability concern in circuit based technologies that utilize PMOS transistors, such as advanced complementary metal oxide semiconductor (CMOS) technology.

NBTI is also a concern when managing long-term parameter drifts for comparators and other similar electronic devices that include one or more PMOS input pairs. In particular to comparators used to monitor voltage levels, if the PMOS input pair is not working under substantially similar operating conditions for a period of time, the electronic devices will experience a parameter drift at the two different PMOS inputs. The input offset voltage for the electronic device could continue to drift higher as the device continues to operate. For instance, the input offset voltage for a comparator can drift as high as tens of millivolts (mV) or even hundreds of mV depending on different process technology and/or inherent device properties. If large enough, the input offset voltage may cause the long-term parameters to drift out of the device's operating specification. To compound the problem, long-term parameter drifts are difficult to detect during automatic test equipment (ATE) testing and/or simulation checks. As such, minimizing long-term parameter drifts from NBTI for electronic devices, such as comparators that monitors voltage levels, remain valuable in improving the performance of the electronic devices with PMOS inputs.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one embodiment, a system comprising: a comparator circuit comprising a first input terminal, a second input terminal, a first output terminal, and a second output terminal and a voltage monitoring circuit comprising a first input monitoring terminal, a second monitoring input terminal, and an output monitoring terminal, wherein the first input monitoring terminal is configured to receive a monitored voltage level, wherein the first input terminal is configured to receive a reference voltage, wherein the second monitoring input terminal is connected to the first output terminal and the output monitoring terminal is connected to the second input terminal to form a closed loop circuit, and wherein the second output terminal is configured to provide a comparator output indicative of an operating state of the voltage monitoring circuit.

In another embodiment, a voltage monitoring circuit comprising: a voltage monitoring terminal configured to receive a monitoring voltage, a first resistor comprising a first resistor end coupled to the voltage monitoring terminal and a second resistor end coupled to a drain node of a monitoring transistor, a second resistor comprising a first resistor end coupled to a source node of the monitoring transistor and an input terminal of a comparator circuit, and a monitoring transistor coupled between the first resistor and the second resistor, wherein the monitoring transistor comprises a gate node that is coupled to an output terminal of the comparator circuit, wherein the monitoring transistor is configured to match a feedback voltage supplied to the input terminal of the comparator circuit to a reference voltage obtained by the comparator circuit based on a determination that the monitoring voltage is equal to or exceeds a monitoring threshold voltage.

In yet another embodiment, a method comprising: receiving, at a voltage monitoring circuit, a monitoring voltage corresponding to a power system, determining, at the voltage monitoring circuit, whether the monitoring voltage is equal to or exceeds a monitoring threshold voltage, receiving, at the voltage monitoring circuit, an output indicating whether an inputted reference voltage and an inputted feedback voltage at a comparator circuit differs, regulating, at the voltage monitoring circuit, a feedback voltage to match the inputted reference voltage based on the output and a determination that the monitoring voltage is equal to or exceeds the monitoring threshold voltage, and providing, from the voltage monitoring circuit, the feedback voltage as an updated inputted feedback voltage for the comparator circuit.

BRIEF DESCRIPTION OF THE DRAWINGS

For a detailed description of various examples, reference will now be made to the accompanying drawings in which.

While certain embodiments will be described in connection with the illustrative embodiments shown herein, the invention is not limited to those embodiments. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The terms "a," "an," and "the" are not intended to refer to a singular entity unless explicitly so defined, but include the general class of which a specific example may be used for illustration. The use of the terms "a" or "an" may therefore mean any number that is at least one, including "one," "one or more," "at least one," and "one or more than one." The term "or" means any of the alternatives and any combination of the alternatives, including all of the alternatives, unless the alternatives are explicitly indicated as mutually exclusive. The phrase "at least one of" when combined with a list of items, means a single item from the list or any combination of items in the list. The phrase does not require all of the listed items unless explicitly so defined.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

Various example embodiments are disclosed herein that manage input offset voltages and/or parameter drifts for a comparator. The electronic device may include or be coupled to a voltage monitoring circuit that reduces the voltage differences between input terminals of the electronic device caused from different operating conditions and/or inherent device properties. The comparator is configured to compare a reference voltage received at a first input terminal (e.g., a non-inverting input terminal) to a feedback voltage at a second input terminal (e.g., inverted input terminal). The feedback voltage is based on a monitoring voltage the voltage monitoring circuit receives as input. When the voltage monitoring circuit is in a regulation operation state, the voltage monitoring circuit regulates the feedback voltage at the second input terminal to follow the reference voltage at the first input terminal. Specifically, the voltage monitoring circuit is configured to regulate the feedback voltage using a closed loop in order to minimize the voltage differences supplied to the two input terminals. The closed loop, voltage regulation allows the voltage monitoring circuit to continuously monitor and adjust the feedback voltage supplied to the second input terminal in order to counter parameter drift and/or changes in the input offset voltage at the two input terminals. The voltage monitoring circuit is in the regulation operation state when the voltage monitoring circuit obtains a monitoring voltage that equals and/or exceeds a set monitoring threshold. In one embodiment, the voltage monitoring circuit includes a monitoring transistor coupled to two resistors, where one resistor is coupled to the drain node of the monitoring transistor and the other resistor is coupled to the source node of the monitoring transistor. The monitoring threshold is set based on the reference voltage supplied at the first terminal and the resistance values for the two resistors.

Figure 1:
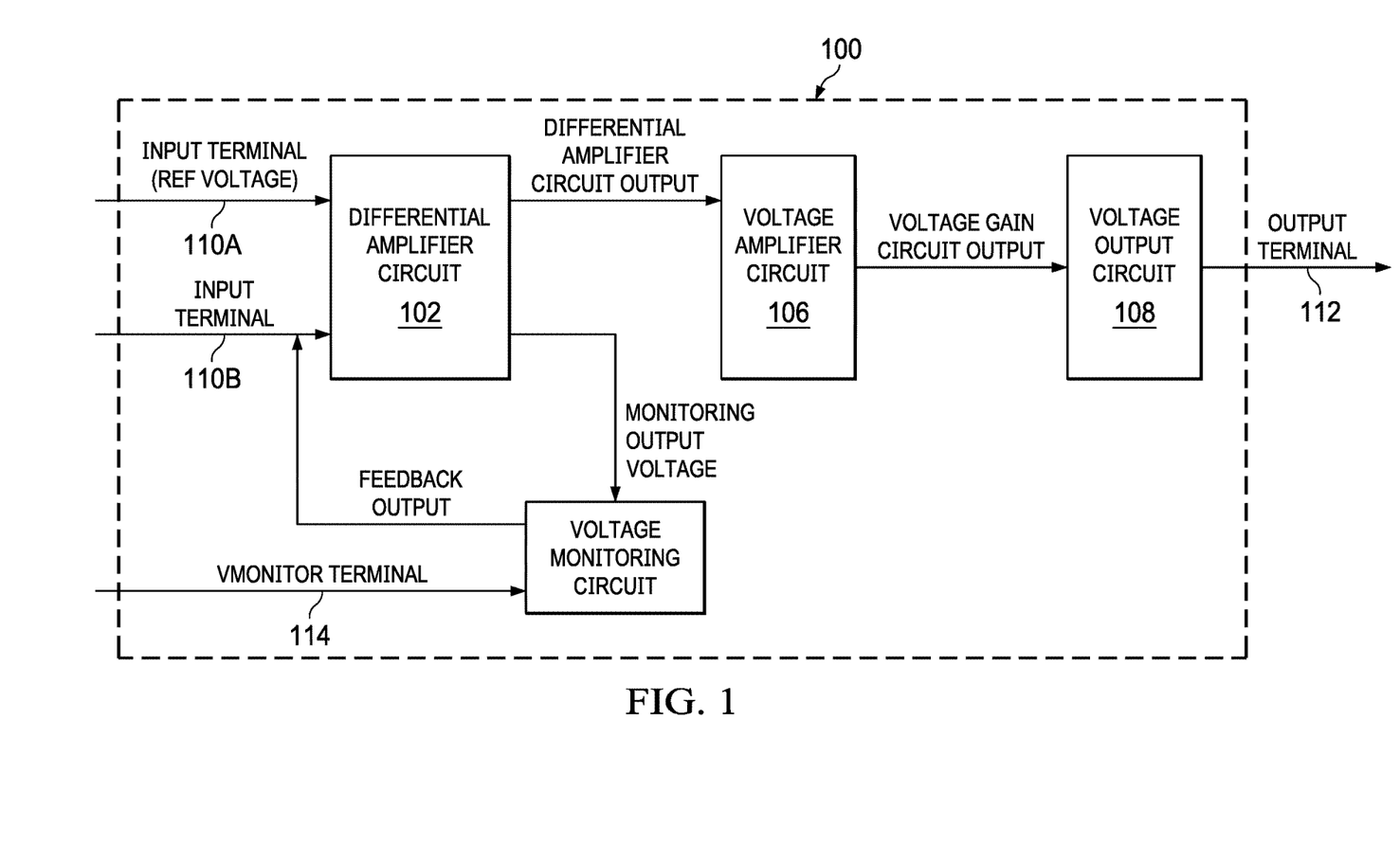
FIG. 1 is a block diagram of an electronic device in accordance with various embodiments.

FIG. 1 is a block diagram of an electronic device 100 in accordance with various embodiments. As an example, the electronic device 100 could be a comparator, where input terminal 110A represents a non-inverted input terminal and input terminal 110B represents an inverted input terminal 110B. Alternatively, in other embodiments of electronic device 100, the input terminal 110A represents an inverted input terminal and input terminal 110B represents a non-inverted input terminal. As a comparator, the electronic device 100 is configured to compare two voltages or currents received at the input terminal 110A and 110B and generate an output electrical signal (e.g., analog or digital) based on the comparison between the two input terminals. For example, the comparator may generate an output signal that represents a value of zero or one depending on the voltages and/or currents at input terminals 110A and 110B. In FIG. 1, the electronic device 100 is configured to compare a monitored voltage to a reference voltage, where the reference voltage is either generated within the electronic device 100 or externally supplied to the electronic device 100.

Figure 4:
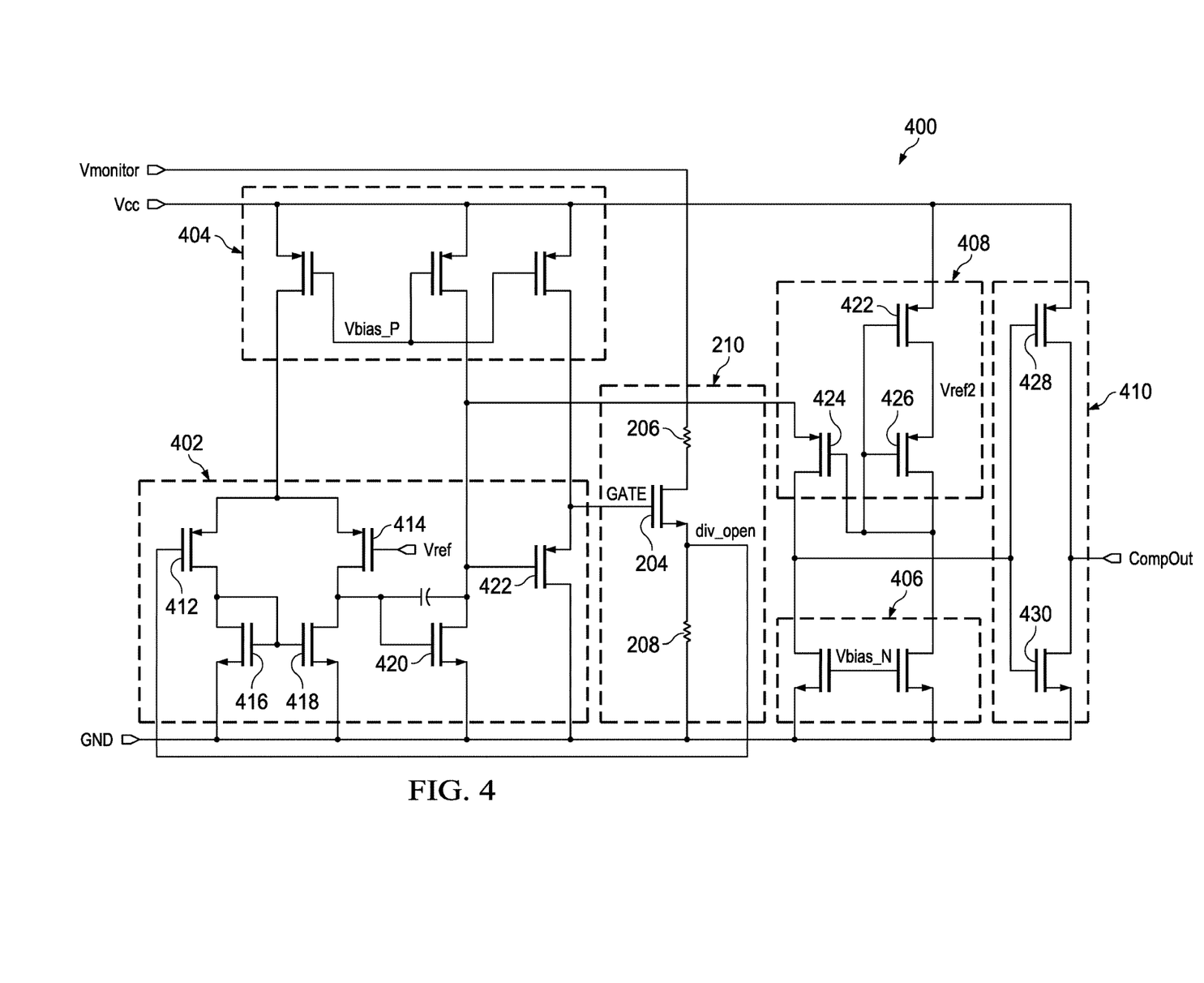
FIG. 4 is a schematic diagram of another embodiment of a comparator system that includes a voltage monitoring circuit to reduce input offset voltages and/or parameter drift.

As shown in FIG. 1, the electronic device 100 includes a differential amplifier circuit 102, a voltage monitoring circuit 104, a voltage amplifier circuit 106, and a voltage output circuit 108 to compare the monitored voltage (e.g., voltage from a battery) to the reference voltage. The differential amplifier circuit 102 receives input voltages at two different input terminals 110A and 110B of the electronic device 100. When the differential amplifier circuit 102 receives the input voltages at input terminal 110A and 110B, detected voltage differences at the input terminals 110A and 110B cause a rise in differential currents within the differential amplifier circuit 102. The differential amplifier circuit 102 can translate the rise in the differential currents to produce one or more differential amplifier circuit outputs (e.g., a single-ended output and/or differential outputs). An example of a differential amplifier circuit 102 is shown in FIG. 4 that utilizes p-type transistors for the input terminals 110A and 110B. Other embodiments of electronic device 100 could utilize other differential amplifier circuit designs based on a variety of design considerations that include, but are not limited to, balancing processing speed and power tradeoffs, improving input impedance and/or gain, reducing noise and/or device size, and/or minimizing operation imperfections.

The differential amplifier circuit 102 also generates a monitoring output voltage to the voltage monitoring circuit 104. The voltage monitoring circuit 104 also receives as input a monitoring voltage at the Vmonitor terminal 114 from a monitored power source (e.g., a battery and/or some other charging source), power-distribution line, power circuit, and/or any other type of power system that provides specified voltage levels. The monitored power system may be directly connected to the voltage monitoring circuit 104 or indirectly coupled to the voltage monitoring circuit 104. Recall that because of temperature effects and other instabilities originating from inherent device properties, the electronic device 100 could suffer from offset voltages and/or long-time parameter drift issues caused from different operating conditions at the input terminals 110. For example, when the differential amplifier circuit 102 utilizes a PMOS input pair, the electronic device 100 could suffer from long-term parameter drift caused from NBT at any of the two input terminals 110A and 110B. The offset voltages and/or long-time parameter drift issues could then unexpectedly cause relatively large voltage differences between the two input terminals 110A and 110B.

When the voltage monitoring circuit 104 receives a monitored voltage at the Vmonitor terminal 114 that exceeds a set monitoring threshold, the voltage monitoring circuit 104 is in a regulation operation state and uses the differential amplifier circuit output to prevent and/or minimize voltage differences at the two input terminals 110A and 110B to generate the feedback output. To compensate for these offset and drift issues, the voltage monitoring circuit 104 utilizes a closed loop to adjust the voltage at input terminal 110B to closely match and follow the reference voltage level supplied to input terminal 110A. As shown in FIG. 1, the closed loop involves the voltage monitoring circuit 104 receiving the differential amplifier circuit output and generating a feedback output to the input terminal 110B based on the differential output. In situations when the monitored voltage supplied at the Vmonitor terminal 114 is less than the set monitoring threshold, the voltage monitoring circuit 104 transitions to a switch-on operation state and stops matching the voltage at input terminal 110B with the reference voltage. Having the voltage monitoring circuit 104 transition to the switch-on operation state also causes the differential amplifier circuit 102 to detect a voltage and/or current difference between the two input terminals 110A and 110B. The voltage monitoring circuit 104 is discussed in more detail in FIGS. 2-4.

The voltage amplifier circuit 106 receives the differential amplifier circuit output and generates a voltage gain circuit output to supply the voltage output circuit 108. In other words, the voltage amplifier circuit 106 is configured to increase the voltage gain of the received differential output. Based on the voltage gain circuit output, the voltage output circuit 108 produces an output on the output terminal 112. Using FIG. 1 as an example, the voltage output circuit 108 may generate a relatively low output to represent that the monitored voltage supplied to the Vmonitor terminal 114 is less than the set monitoring threshold. Conversely, the voltage output circuit 108 could generate a relatively high output to represent that the monitor voltage supplied to the Vmonitor terminal 114 is equal to or greater than the set monitoring threshold. Other embodiments of the voltage output circuit 108 may be configured to do the inverse, where the relatively high output represents that the supplied monitor voltage at the Vmonitor terminal 114 is less than the set monitoring threshold, and the relatively low output represents that the supplied monitor voltage at the Vmonitor terminal 114 is equal to or greater than the set monitoring threshold.

Although FIG. 1 illustrates a specific embodiment of an electronic device 100 that monitors and compares monitoring voltage to a reference voltage, the disclosure is not limited to the specific embodiment illustrated in FIG. 1. For instance, although FIG. 1 illustrates that the electronic device 100 includes a differential amplifier circuit 102, a voltage monitoring circuit 104, a voltage amplifier circuit 106, and a voltage output circuit 108, the electronic device 100 could also include other components that are known by persons of ordinary skill in the art typically found in comparators. Additionally, other embodiments of the electronic device 100 may combine one or more components into a single component. The use and discussion of FIG. 1 is only an example to facilitate ease of description and explanation.

Figure 2:
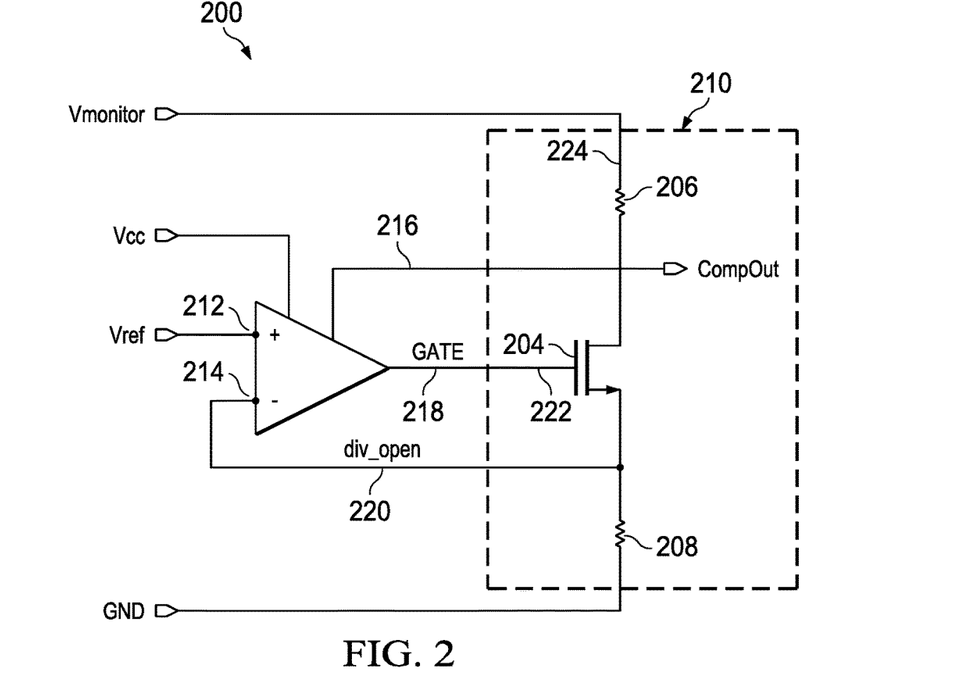
FIG. 2 is a schematic diagram of an embodiment of a comparator system that includes a voltage monitoring circuit to prevent and/or minimize input offset voltages and/or parameter drifting.

FIG. 2 is a schematic diagram of an embodiment of a comparator system 200 that includes a voltage monitoring circuit 210 that minimizes the impact of input offset voltages and/or parameter drifting at the input terminals 212 and 214. In one embodiment, the comparator system 200 corresponds to or is part of the electronic device 100 shown in FIG. 1. FIG. 2 illustrates that the comparator system 200 includes a comparator circuit 202 and a voltage monitoring circuit 210. The comparator circuit 202 contains a non-inverting input terminal 212 and an inverting input terminal 214. The non-inverting input terminal 212 receives a reference voltage (e.g., internally or externally supplied by the comparator circuit 202), which is labeled Vref in FIG. 2, and the inverting input terminal 214 receives a feedback voltage, which FIG. 2 depicts as "div_open." The comparator circuit 202 produces an output voltage on output terminal 216 of the comparator system 200, which FIG. 2 labels as "CompOut," and a monitoring gate voltage (labeled as "gate" voltage in FIG. 2) on monitoring terminal 218. The output voltage on output terminal 216, CompOut, changes as the monitoring circuit 210 transitions between the regulation and switch-on operation states. FIG. 2 also depicts that the comparator circuit receives a power supply voltage labeled as "Vcc" in FIG. 2.

The voltage monitoring circuit 210 includes a monitoring voltage terminal 224, a voltage monitoring input terminal 222, and a feedback output terminal 220. The monitoring voltage terminal 224 receives the monitoring voltage, Vmonitor, by directly connecting to and/or indirectly coupling to a power source, power-distribution line, power circuit, and/or any other type of system that provides specified voltage levels. The voltage monitoring input terminal 222, which connects to the gate node of the monitoring transistor 204, is connected to the monitoring terminal 218 and receives the monitoring gate voltage from the comparator circuit 202. The feedback output terminal 220 is connected to the inverting terminal 214 to form the closed loop circuit between the comparator circuit 202 and the voltage monitoring circuit 210. Other embodiments of comparator system 200 may have the voltage monitoring circuit 210 connected to the non-inverting terminal 212 and the reference voltage, Vref, is supplied to the inverting terminal 214.

FIG. 2 also illustrates that the voltage monitoring circuit contains a monitoring transistor 204 that has its drain node coupled to resistor 206 and its source node coupled to resistor 208. The monitoring transistor 204 may be implemented using a variety of different types of electrical switches, such as a field-effect transistor (FET). For example, the monitoring transistor 204 could be an enhanced n-channel metal-oxide semiconductor field-effect (NMOS) transistors. Alternatively, the monitoring transistor 204 could be other types of electrical switches including other types of NMOS transistors, a n-type junction gate field-effect transistor (NJFET), and a bipolar junction transistor (BJT), such as NPN transistors. Resistors 206 and 208 may also be implemented using a variety of different types of resistors. Examples of resistors include, but are not limited to, carbon composition resistors and semiconductor resistors (e.g., surface mount resistors). Additionally or alternatively, persons of ordinary skill in the art are aware that the voltage monitoring circuit 210 may set the resistance values for resistors 206 and/or 208 using other types of electronic components (e.g., FETs operating in triode region) in lieu of resistor components.

In FIG. 2, the voltage monitoring circuit 210 receives a monitoring voltage (labeled as "Vmonitor" in FIG. 2) at monitoring voltage terminal 224 and determines whether the monitoring voltage exceeds a certain monitoring threshold. The monitoring voltage may be supplied directly or indirectly from a power system, such as a battery. The voltage monitoring circuit 210 sets the monitoring threshold based on the resistance values of resistors 206 and 208 and the reference voltage supplied at the non-inverting input terminal 212. Equation 1, presented below, represents an expression for defining the monitoring threshold.

$$V\text{threshold}=V\text{ref}((R0+R1)/R1) \quad (1)$$

In equation 1 shown above, Vthreshold represents the monitoring threshold for the voltage monitoring circuit 210; Vref represents the reference voltage received at non-inverting input terminal 212; R0 represents the resistance value of resistor 206; and R1 represents the resistance value of resistor 208.

When Vmonitor is less than the monitoring threshold, the voltage monitoring circuit 210 is in a switch-on operating state, where the monitoring transistor 204 is operating in a linear region. At this point in time, the monitoring transistor 204 is fully turns on and acts as a closed switch. Based on the closed loop circuit, the monitoring gate voltage, which is the voltage to the gate node of monitoring transistor 204, is driven to the power supply voltage, Vcc, to fully turn on the monitoring transistor 204. During the switch-on operating state, the source voltage and drain voltage of the monitoring transistor 204 is almost equal, with little to no voltage drop across the drain-source nodes of the monitoring transistor 204. The voltage drop for resistor 206 is shown below in equation 2, and the voltage drop for resistor 208 is shown below in equation 3.

$$V\text{drop}(R0)=V\text{monitor}(R0/(R0+R1)) \quad (2)$$

$$V\text{drop}(R1)=V\text{monitor}(R1/(R0+R1)) \quad (3)$$

In equations 2 and 3 shown above, Vdrop (R0) represents the voltage drop at resistor 206 in the switch-on operation state; Vdrop (R1) represents the voltage drop at resistor 208 in the switch-on operation state; Vmonitor represents the monitoring voltage at monitoring voltage terminal 224; R0 represents the resistance value of resistor 206; and R1 represents the resistance value of resistor 208. The current that flows through the monitoring transistor 204 is presented below in equation 4.

$$Ids(\text{monitoring transistor 204})=V\text{monitor}/(R0+R1) \quad (4)$$

In equation 4, Ids (monitoring transistor 204) represents the drain-to-source current for monitoring transistor 204; Vmonitor represents the monitoring voltage at monitoring voltage terminal 224; R0 represents the resistance value of resistor 206; and R1 represents the resistance value of resistor 208. Based on equation 4, the voltage supplied to the inverting terminal 214 is expressed below in equation 5.

$$V\text{monitor}*R1/(R0+R1) \quad (5)$$

Consistent with equations 2-4, Vmonitor represents the monitoring voltage at monitoring voltage terminal 224; R0 represents the resistance value of resistor 206; and R1 represents the resistance value of resistor 208. Because Vmonitor is less than the monitoring threshold as defined in equation 1, the voltage supplied to the inverting terminal 214 is less than the reference voltage, Vref. In other words, during the switch-on operation state, the closed loop circuit is unable to raise the voltage supplied to the inverting terminal 214 to reach the reference voltage, Vref.

The monitoring circuit 210 is in a regulation operation state when the monitoring voltage, Vmonitor, is determined to be equal or above the monitoring threshold. In the regulation operation state, the monitoring transistor 204 is operating in the saturation region. The amount of current flowing through monitoring transistor 204 can be estimated with equation 2.

$$Ids(\text{monitoring transistor 204})=V\text{ref}/R1 \quad (6)$$

In equation 6 shown above, Ids (monitoring transistor 204) represents the drain-to-source current for monitoring transistor 204; Vref represents the reference voltage received at non-inverting input terminal 212; and R1 represents the resistance value of resistor 208. When the monitoring circuit 210 is in the regulation operation state, the resistors 206 and 208 divide the monitoring voltage to produce a feedback voltage that is set to follow the reference voltage because of the closed loop circuit. Specifically, the voltage drop at the resistors 206 and 208 are shown below in equations 7 and 8, respectively, and the voltage drop of the monitoring transistor's drain-source nodes is provided in equation 9 below.

$$V\text{drop}(R0)=V\text{ref}(R0/R1) \quad (7)$$

$$V\text{drop}(R1)=V\text{ref} \quad (8)$$

$$V\text{drop}(\text{source-drain})=V\text{monitor}-V\text{ref}*((R0+R1)/R1) \quad (9)$$

In equations 7-9 shown above, Vdrop (R0) represents the voltage drop at resistor 206 in the regulation operation state; Vdrop (R1) represents the voltage drop at resistor 208 in the regulation operation state; Vdrop (source-drain) represents the voltage drop at the source node and drain node at monitoring transistor 204; Vref represents the reference voltage received at non-inverting input terminal 212; Vmonitor represents the monitoring voltage at monitoring voltage terminal 224; R0 represents the resistance value of resistor 206; and R1 represents the resistance value of resistor 208.

As shown in FIG. 2, the feedback output terminal 220 supplies the feedback voltage, div_open, as the input voltage to the comparator circuit 202 on the inverting terminal 214. Specifically, the source node of monitoring transistor 204 is coupled to the inverting input terminal 214. Additionally, when the monitoring voltage, Vmonitor is equal to or greater than the monitoring threshold, the monitoring gate voltage received at the voltage monitoring input terminal 222 drops from the power supply voltage, Vcc, to a lower voltage as estimated with equation 10, shown below.

$$V\text{gate}=V\text{ref}+Vgs \quad (10)$$

In equation 10, Vgate represents the monitoring gate voltage supplied to the gate node of the monitoring transistor 204, Vref represents the voltage value of reference voltage, and Vgs represents the voltage difference between the monitoring gate voltage and the voltage at the source node of monitoring transistor 204.

Figure 3:
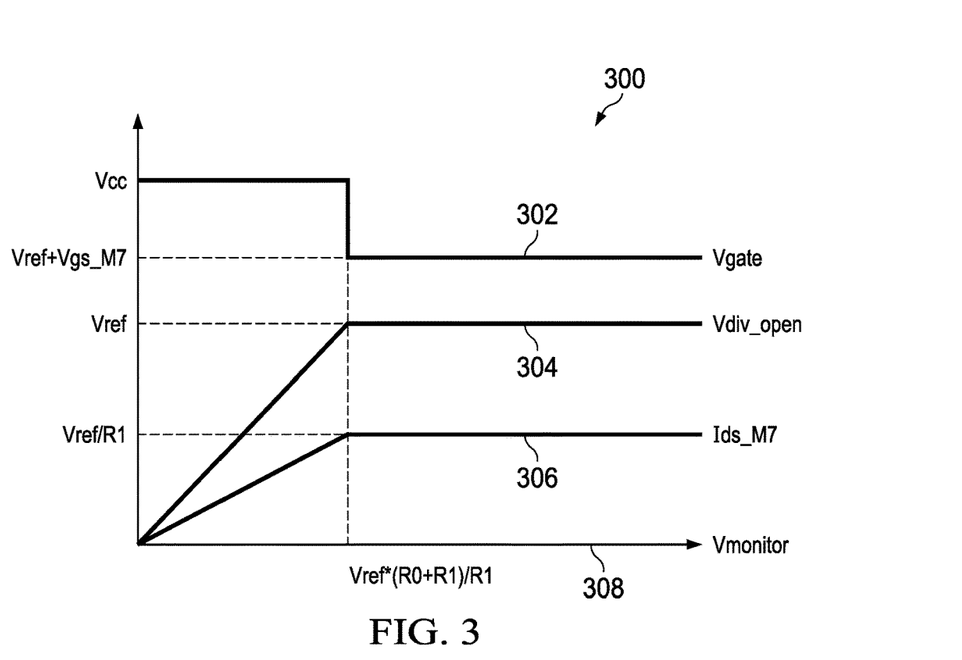
FIG. 3 is a voltage-current graph corresponding to the monitoring transistor located within the voltage monitoring circuit.

FIG. 3 is a voltage-current graph 300 corresponding to the monitoring transistor located within the voltage monitoring circuit. The monitoring transistor, which is shown in FIGS. 2 and 4 as monitoring transistor 204, controls and regulate the voltage at one of the input terminals of the comparator circuit. The voltage-current graph 300 includes multiple voltage curves 302 and 304, and a current curve 306 that relates to the operation of the monitoring transistor. Specifically, the voltage-current graph 300 depicts the relationship between the monitoring gate voltage supplied to the gate node of the monitoring transistor (Vgate) (e.g., monitoring terminal 218 in FIG. 2), the feedback voltage (div_open), the drain-to-source current (Ids), and the monitor voltage, Vmonitor. FIG. 3 illustrates that the monitoring transistor is operating in the saturation region once monitor voltage exceeds the monitoring threshold, which was earlier defined in equation 1 as "Vref(R0+R1)/R1."

The voltage-current graph 300 illustrates the transition of the monitoring transistor from the linear region to the saturation region. In FIG. 3, when the monitoring transistor is initially operating in the linear region, the voltage monitoring circuit is in a switch-on operation state until the monitoring voltage, Vmonitor, on the x-axis 308 reaches the defined monitoring threshold set out in equation 1. During the switch-on operation state, the gate node voltage curve 302 illustrates that the monitoring gate voltage for the monitoring transistor is driven to Vcc. Since the monitoring transistor is fully on with no voltage difference between its source and drain nodes, the feedback voltage curve 304 has div_open start at about zero volts and gradually increases as the monitoring voltage, Vmonitor, increases. The Ids curve 306 for the monitoring transistor also initially starts about zero volts and gradually increases as the monitoring voltage, Vmonitor, increases, and the monitoring transistor approaches the saturation region.

In FIG. 3, when the monitoring voltage, Vmonitor, on the x-axis 308 equals to or exceeds the monitoring threshold, the monitoring transistor enters the saturation region. When in the saturation region, the voltage monitoring circuit transitions into the regulation operation stage. The Ids curve 306 shows that the Ids current for the monitoring transistor saturates at a value determined from equation 6. The feedback voltage curve 304 illustrates that the feedback voltage, div_open reaches the reference voltage, Vref. For the gate node voltage curve 302, the monitoring gate voltage drops from Vcc to a lower voltage value shown in equation 10.

FIG. 4 is a schematic diagram of another embodiment of a comparator system 400 that includes a voltage monitoring circuit to reduce input offset voltages and/or parameter drift. In relation to FIG. 1, the comparator system 400 may represent or be part of the electronic device 100 shown in FIG. 1. FIG. 4 illustrates that comparator system 400 includes a differential amplifier circuit 402 that is coupled to a voltage monitoring circuit 210 and a voltage amplifier circuit 408. The differential amplifier circuit 402 is an example embodiment of the differential amplifier circuit 102 shown in FIG. 1. The differential amplifier circuit 402 includes p-type transistors 412, 414, and 422 and n-type transistors 416, 418, and 420. In one or more embodiments, the p-type transistors 412, 414, and/or 422 may be any type of p-type FET, such as PMOS transistor, p-type junction gate field-effect transistor (PJFET), and/or PNP BJTs. The N-type transistors 416, 418, and 420 may be any type of n-type FETs, such as NMOS transistors, NJFETs, and NPN BJTs. In FIG. 4, the two input terminals to the differential amplifier circuit 402 are connected to the p-type transistors 412 and 414.

In FIG. 4, the differential amplifier circuit 402 generates a voltage monitoring output, which is also referred to as the monitoring gate voltage within this disclosure, to provide to the voltage monitoring circuit 210 as an input. The differential amplifier circuit 402 receives the Vref voltage at p-type transistor 414 and the feedback voltage, div_open, at p-type transistor 412. When the p-type transistor 412 receives a feedback voltage, div_open that is less than the Vref voltage p-type transistor 414 receives, the additional current that passes through the p-type transistor 412 drives n-type transistors 416 and 418 further into conduction. With n-type transistor 418 further into conduction, n-type transistor 420 is driven out of conduction, which in turn causes p-type transistor 422 to also be driven out of conduction. With p-type transistor 422 driven out of conduction within the differential amplifier circuit 402, the voltage supply (e.g., Vcc) biasing circuit 404 drives the monitoring gate voltage for the gate node of the monitoring transistor 204 to a higher voltage level.

Recall that the voltage monitoring circuit 210 is in a regulation operating state when the monitoring voltage, Vmonitor, is equal to or greater than a monitoring threshold and in a switch-on operation state when the monitoring voltage, Vmonitor, is less than the monitoring threshold. Having the voltage monitoring circuit 210 in a regulation operating state allows the feedback voltage, div_open supplied at one of the input terminals of the differential amplifier 402 to closely match and follow the reference voltage, Vref supplied at the other input terminal. When the voltage monitoring circuit 210 is in the regulation operating state, having the voltage supply, biasing circuit 404 drive the monitoring gate voltage higher causes the feedback voltage, div_open, to increase. Since the feedback voltage was initially lower than reference voltage, the voltage monitoring circuit 210 increases the feedback voltage to better match the reference voltage, Vref. The feedback voltage is then sent back the gate node of p-type transistor 412 to have the differential amplifier circuit 402 further evaluate voltage differences between the reference voltage and the feedback voltage. When the voltage monitoring circuit 210 is in the switch-on operation state, the voltage supply, biasing circuit 404 drives the monitoring gate voltage for the gate node to the power supply voltage, Vcc.

FIG. 4 also illustrates that the differential amplifier 402 produces a second output signal that corresponds to the comparator system's 400 output (shown in FIG. 4 as "CompOut"). In FIG. 4, the second output signal from the differential amplifier 402 is sent to the voltage amplifier circuit 408 which then sends the voltage gain circuit output to the voltage output circuit 410 to generate the comparator system's output, CompOut. The voltage supply, biasing circuit 404 connects to the drain node of n-type transistor 420, where the connection point provides the second output signal. When the voltage monitoring circuit 210 is in the switch-on operation state, the feedback voltage div_open is at a relatively low voltage and is less than the reference voltage. As previously mentioned, n-type transistor 420 is driven out of conduction when the feedback voltage is less than the reference voltage, which causes the second output signal to be a relatively high voltage. When the voltage monitoring circuit 210 is in the regulation operating state, n-type transistor 420 is driven more into conduction cause the second output signal to be a relatively lower voltage. Although FIG. 4 illustrates that comparator system 400 produces a single output signal, "CompOut, other embodiments could have the comparator system 400 generate more than one output signal (e.g., two differential outputs).

The voltage amplifier circuit 408 includes transistors 422, 424, and 426. The source node of the p-type transistor 424 receives the second output signal from the differential amplifier 402 and compares the voltage level of the second output signal to the Vref2 voltage level located between the source node of the p-type transistor 426 and the drain node of the p-type transistor 422. When the voltage monitoring circuit 210 is in the switch-on operation state, the second output signal has a voltage level that is greater than the Vref2 voltage level. In this instance, the voltage gain circuit output will be a relatively high voltage. When the voltage monitoring circuit 210 is in the regulation operating state, the second output signal has a voltage level that is less than the Vref2 voltage level. When this occurs, the voltage gain circuit output will be relatively low voltage. To produce the relatively low voltage for the voltage gain circuit output, the comparator system 400 includes a ground biasing circuit 406.

The voltage output circuit 410 the comparator system's output, CompOut, based on the voltage gain circuit output received from the voltage gain circuit 408. In FIG. 4, the voltage output circuit 410 includes a p-type transistor 428 and an n-type transistor 430 to form a CMOS output drive circuit. When the voltage gain circuit output is a relatively low voltage, the voltage output circuit 410 generates an output value that is relatively high (e.g., a logic one output) and generates a relatively low output value (e.g., a logic zero output) when the voltage gain circuit output is a relatively high voltage. Stated another way, the comparator system's output, CompOut is set to produce a relatively low output value when the monitoring voltage, Vmonitor, is less than the monitoring threshold and a relatively high output value when the monitoring voltage, Vmonitor, is equal to or greater than the monitoring threshold.

Figure 5:
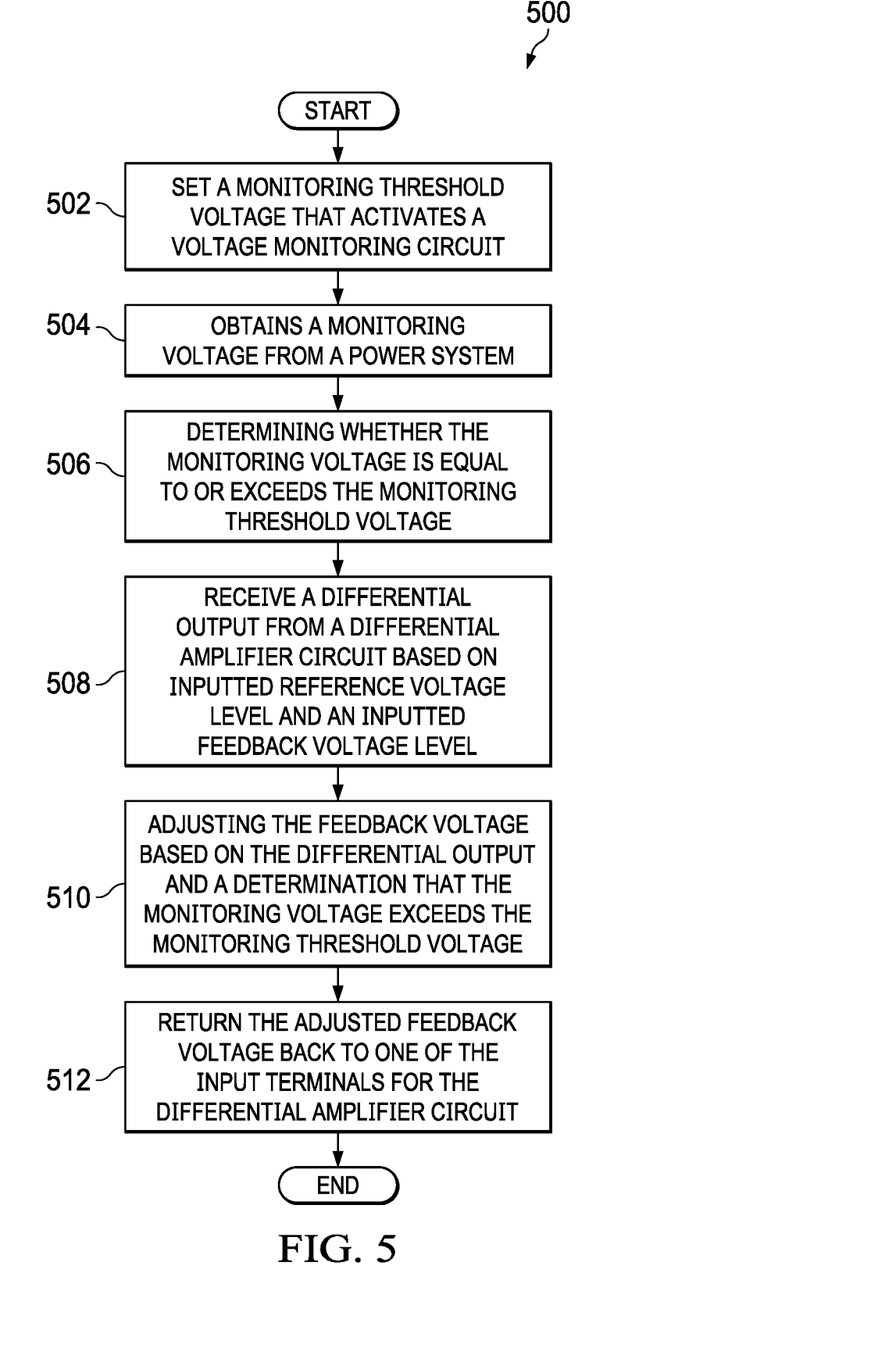
FIG. 5 is a flow chart of an embodiment of a method to prevent and minimize input offset voltages and parameter drift for an electronic device.

FIG. 5 is a flow chart of an embodiment of a method 500 to prevent and minimize the effects of input offset voltages and parameter drift for an electronic device. Using FIGS. 2 and 4 as examples, method 500 can be implemented using the comparator system 200 and 400, respectively. In one or more embodiments, method 500 is specifically implemented within the voltage monitoring circuit 210. Although FIG. 5 illustrates that the blocks of method 500 are implemented in a sequential operation, method 500 is not limited to this order of operations, and instead other embodiments of method 500 may have one or more blocks implemented in parallel operations. For example, blocks 504 and 506 can be implemented sequentially or in parallel.

Method 500 starts at block 502 and sets a monitoring threshold voltage that activates a voltage monitoring circuit. In one embodiment, as referenced in equation 1, the monitoring threshold voltage is based on the reference voltage and two resistance values. One of the resistance values corresponds to a resistor that connects to a drain node of the monitoring transistor, and the second resistance value corresponds to a resistor that connects to the source node of the monitoring transistor. Method 500 then moves to block 504 and obtains a monitoring voltage from a power system, such as a battery. Method 500 continues to block 506 to determine whether the monitored voltage is equal to or exceeds the monitoring threshold voltage. In one embodiment, method 500 compares the monitored voltage with the monitoring threshold voltage to determine whether the voltage monitoring circuit is in a regulation operation state or a switch-on operation. In the regulation operation state, method 500 may regulate the voltage received at a differential amplifier circuit to match the reference voltage, Vref. Conversely, in the switch-on operation state, method 500 may be unable to regulate the voltage received at the differential amplifier circuit to match the reference voltage, Vref.

Method 500 continues to block 508 and receives an output from a differential amplifier circuit based on an inputted reference voltage level and inputted feedback voltage level. The output is based on differences detected between the inputted reference voltage level and feedback voltage level. For example, method 500 may receive a relatively high output value (e.g., Vcc voltage) when the feedback voltage level is less than the inputted reference voltage and a relatively lower output value (e.g., Vref+Vgs (equation 10)) when the feedback voltage is equal to or greater than the inputted reference voltage. Method 500 then moves to block 510 and adjusts the feedback voltage based on the differential output and determination that the monitoring voltage exceeds the monitoring threshold voltage. As an example, when the feedback voltage is less than the reference voltage, method 500 increases the feedback voltage to closely match the reference voltage. When the feedback voltage is greater than the reference voltage, method 500 decreases the feedback voltage to closely match to the reference voltage. Method 500 may not adjust the feedback voltage if the monitoring voltage does not exceed the monitoring threshold. Method 500 then moves to block 512 and returns the adjusted feedback voltage back to one of the input terminals for the differential amplifier circuit for further comparison.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. A system comprising:
a comparator circuit having a first input terminal, a second input terminal, a first output terminal, and a second output terminal; and
a voltage monitoring circuit having a first input monitoring terminal, a second monitoring input terminal, and an output monitoring terminal,
the first input monitoring terminal is a monitored voltage level input,
the first input terminal is a reference voltage input,
the second monitoring input terminal is connected to the first output terminal and the output monitoring terminal is connected to the second input terminal to form a closed loop circuit, and
the second output terminal is a comparator output that is free of the voltage monitoring circuit and that indicates an operating state of the voltage monitoring circuit.

2. The system of claim 1, in which the voltage monitoring circuit includes a first resistor connected to a drain of a monitoring transistor and a second resistor connected to a source of the monitoring transistor, and the first resistor is connected to the first input monitoring terminal and the output monitoring terminal is located between the monitoring transistor and the second resistor.

3. The system of claim 2, in which the second monitoring input terminal is connected to a gate of the monitoring transistor.

4. The system of claim 3, in which a monitoring threshold is set based on a resistance value of the first resistor, a resistance value of the second resistor, and the reference voltage.

5. The system of claim 2, in which the monitoring transistor is an n-type transistor.

6. The system of claim 1, in which the voltage monitoring circuit sets a voltage level for the second input terminal to be less than the reference voltage when the monitored voltage level is less than a monitored threshold of the voltage monitoring circuit.

7. The system of claim 1, in which the voltage monitoring circuit regulates a voltage level for the second input terminal to be set at the reference voltage when the monitored voltage level is greater than or equal to a monitored threshold of the voltage monitoring circuit.

8. The system of claim 1, in which the first input terminal is a non-inverting terminal and the second input terminal is an inverting terminal.

9. The system of claim 1, wherein in which the comparator circuit includes a differential amplifier circuit with a first output connected to the first output terminal and a second output coupled to the second output terminal, the first output and the second output are connected to a voltage supply, biasing circuit.

10. The system of claim 9, in which the comparator circuit includes an inverter output coupled between the second output and the second output terminal.

11. A method comprising:
receiving, at a voltage monitoring circuit, a monitoring voltage corresponding to a power system;
determining, at the voltage monitoring circuit, whether the monitoring voltage is equal to or exceeds a monitoring threshold voltage;
receiving, at the voltage monitoring circuit, an output indicating whether an inputted reference voltage and an inputted feedback voltage at a comparator circuit differs;
regulating, at the voltage monitoring circuit, a feedback voltage to match the inputted reference voltage based on the output and a determination that the monitoring voltage is equal to or exceeds the monitoring threshold voltage;
providing, from the voltage monitoring circuit, the feedback voltage as an updated inputted feedback voltage for the comparator circuit; and
providing from the comparator a comparator output signal free of the voltage monitoring circuit.

12. The method of claim 11, including setting, at the voltage monitoring circuit, the feedback voltage to be less than the inputted reference voltage based on a determination that the monitoring voltage is less than the monitoring threshold voltage.

13. The method of claim 11, in which the monitoring threshold voltage is based on a resistance value of a first resistor within the voltage monitoring circuit, a resistance value of a second resistor within the voltage monitoring circuit, and the inputted reference voltage.

14. The method of claim 11, including receiving, at the voltage monitoring circuit, a relatively higher output gate voltage from the comparator circuit when the monitoring voltage is less than the monitoring threshold voltage when compared to when the monitoring voltage is greater than the monitoring threshold voltage.

15. The method of claim 11, including generating a comparator output signal that is relatively high when the monitored voltage is equal to or greater than the monitoring threshold voltage.

* * * * *